(12) United States Patent
Lal et al.

(10) Patent No.: US 10,771,043 B2
(45) Date of Patent: Sep. 8, 2020

(54) TRANSMIT-RECEIVE DELAY ELEMENT APPARATUS, METHOD, AND APPLICATIONS

(71) Applicant: CORNELL UNIVERSITY, Ithaca, NY (US)

(72) Inventors: Amit Lal, Ithaca, NY (US); Mamdouh Abdelmejeed, Ithaca, NY (US); Justin Kuo, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 25 days.

(21) Appl. No.: 16/085,699

(22) PCT Filed: Mar. 17, 2017

(86) PCT No.: PCT/US2017/022870
§ 371 (c)(1),
(2) Date: Sep. 17, 2018

(87) PCT Pub. No.: WO2017/161220
PCT Pub. Date: Sep. 21, 2017

(65) Prior Publication Data
US 2019/0074818 A1    Mar. 7, 2019

Related U.S. Application Data

(60) Provisional application No. 62/309,611, filed on Mar. 17, 2016.

(51) Int. Cl.
*H03H 9/30* (2006.01)
*H03H 9/13* (2006.01)
*H03H 9/02* (2006.01)

(52) U.S. Cl.
CPC .......... *H03H 9/30* (2013.01); *H03H 9/02102* (2013.01); *H03H 9/131* (2013.01)

(58) Field of Classification Search
CPC ....... H03H 9/30; H03H 9/131; H03H 9/02102
(Continued)

(56) References Cited

U.S. PATENT DOCUMENTS 8,487,511 B2 * 7/2013 Sinha ................. H03H 9/02086
                                                              310/320
2004/0217829 A1 * 11/2004 Maiz ........................ H03H 3/04
                                                              333/188
(Continued)

FOREIGN PATENT DOCUMENTS

KR           20150102729           9/2015

OTHER PUBLICATIONS

International Search Report and Written Opinion for PCT/US2017/022870 dated Jun. 20, 2017; Form PCT/ISA/210 and PCT/ISA/237; 11 pages

*Primary Examiner* — Robert J Pascal
*Assistant Examiner* — Jorge L Salazar, Jr.
(74) *Attorney, Agent, or Firm* — Bond, Schoeneck & King, PLLC; Blaine Bettinger

(57) ABSTRACT

A CMOS compatible GHz ultrasonic pulse/echo transmit-receive ultrasonic delay element demonstrating less than <6 ppm stability over time and having a zero-temperature coefficient of delay at two temperatures. The delay element includes one or more CMOS compatible piezoelectric transducers requiring no release step, which transmit and/or receive a GHz-ultrasonic wave packet. The bulk substrate exhibits low loss for the GHz-ultrasonic wave packet transmitted through the substrate and uses the phenomenon of diffraction to retrieve multiple reflections.

19 Claims, 5 Drawing Sheets

(58) Field of Classification Search
 USPC .................. 333/133, 186, 187, 188, 193–196
 See application file for complete search history.

(56) References Cited

U.S. PATENT DOCUMENTS

| | | |
|---|---|---|
| 2013/0162369 A1 | 6/2013 | Wathen et al. |
| 2014/0219062 A1 | 8/2014 | Rothberg et al. |
| 2015/0251896 A1 | 9/2015 | Rothberg et al. |
| 2015/0298170 A1 | 10/2015 | Rothberg et al. |

* cited by examiner

TRANSMIT-RECEIVE DELAY ELEMENT APPARATUS, METHOD, AND APPLICATIONS

RELATED APPLICATION DATA

This application is a U.S. National Phase filing of International Application No. PCT/US2017/022870 filed Mar. 17, 2017, which itself claims priority to U.S. Provisional Application Ser. No. 62/309,611 filled Mar. 17, 2016, the subject matter of each of which is incorporated by reference herein in its entirety.

BACKGROUND

Aspects and embodiments of the invention pertain to time delay apparatus, methods, and applications thereof; more particularly to CMOS integrated time delay apparatus, methods, and applications thereof; and, most particularly to a CMOS integrated, temperature-compensated, ultrasonic-based time delay apparatus, methods, and applications.

Delay lines (blocks) are ubiquitous in the field of electronics. A delay block is a circuit that shifts the input signal in time by a desired amount, and delivers a delayed output similar to the input signal. Delay elements can be used in wide range of applications including phase modulation in clocking systems, generating stable clocks in digital systems, and RF signal correlation processing. Furthermore, stable delay elements can be used as a timing reference in delay-locked-loops where the delay can be calibrated across different temperature and process variations. Precision and stability in a delay element block is one of the key specifications that directly impacts all the applications.

Different architectures for on-chip delay elements have been reported in the literature. The most commonly used delay method is an inverter-based delay line where the delay is proportional to the number of inverter buffers multiplied by the delay of a single buffer. This architecture is sensitive to process and temperature variations as well as supply voltage fluctuations. RC delay elements are also widely used in different delay-based applications, however, this approach also suffers from high temperature dependence (2500 ppm/° C.). In a reported thyristor-based delay element, the delay is proportional to the current source as well as the threshold voltage of CMOS transistors, thus minimizing the supply dependence and hence enhancing the supply noise rejection. Minimum delay variation to power supply noise of 9.43% was reported with 314 ppm/° C. temperature coefficient. Known surface acoustic wave (SAW)-based and optical delay lines, while less temperature sensitive are difficult to integrate on CMOS with high (long) delay values.

A solution to low stability, achieving longer delay time, control of temperature sensitivity, and creating the compatibility to CMOS integration is provided by the embodied invention in the form of a CMOS compatible pulse/echo transmit-receive ultrasonic delay element that is stable over time to less than 6 ppm and has a zero temperature coefficient of delay at two temperatures.

SUMMARY

An aspect of the invention is an integrated delay apparatus. An exemplary embodiment of the integrated delay apparatus includes a substrate; a single piezoelectric transducer integrally disposed on or in the substrate, wherein the single piezoelectric transducer is adapted to generate an ultrasonic wave packet having a temporal width from 0.5 to 100 nanoseconds, further wherein the substrate has a thickness, h, that is greater than the spatial width of the ultrasonic wave packet corresponding to the temporal width, further wherein an interface between a bottom surface of the substrate and a medium immediately adjacent the bottom surface of the substrate exhibits an impedance mismatch whereby the bottom surface of the substrate is a reflective surface for the ultrasonic wave packet. In various non-limiting, exemplary embodiments the integrated delay apparatus may include the following limitations, features, characteristics, steps alone or in various combinations as one skilled in the art would readily understand:

wherein the interface between the bottom surface of the substrate and the medium immediately adjacent the bottom surface of the substrate is a channel or a cavity in a portion of the bottom surface of the substrate;

wherein the substrate is a material characterized as having a low GHz-ultrasonic wave packet transmission loss;

wherein the substrate is one of Si, SOI, Sapphire, SiC, GaN, a semiconductor, a piezo-material, or a metal;

wherein the single piezoelectric transducer is aluminum nitride (AlN);

further comprising a plurality of vertically stacked substrates;

wherein the single piezoelectric transducer is a transmitting and a receiving transducer;

wherein the single piezoelectric transducer is a transmitting transducer, and further comprising at least one receiving piezoelectric transducer integrally disposed on or in the substrate;

wherein the single transmitting piezoelectric transducer has a largest transverse surface dimension between 0.5 to 20λ, where λ is a longitudinal wavelength of the ultrasonic wave packet with a carrier frequency, f, where f is between 0.5 to 10 GHz;

wherein the at least one receiving piezoelectric transducer is a lateral distance from the transmitting transducer so as to receive a reflected ultrasonic wave packet;

wherein the at least one receiving piezoelectric transducer comprises an integrally disposed periodic array of receiving piezoelectric transducers;

wherein the at least one receiving piezoelectric transducer is integrally disposed on one of the top and bottom surfaces of the substrate or in the substrate;

characterized by a delay time, $\tau$, where $\tau \geq 2h/v_s$, where $v_s$ is the speed of sound in the substrate;

wherein $\tau > 100$ ns;

characterized by a zero-temperature coefficient of delay at two or more temperatures;

characterized in that it is a CMOS integrated delay line;

characterized by an Allan deviation of 0.87 ps (<6 ppm).

An aspect of the invention is a method for generating a stable delay time. An exemplary embodiment of the method for generating a stable delay time includes the steps of generating an ultrasonic wave packet having a temporal width from 0.5 to 100 ns with a carrier frequency, f, where f is between 0.5 to 10 GHz; transmitting the ultrasonic wave packet through a bulk substrate; reflecting the transmitted ultrasonic wave packet from a top and/or a bottom surface of the bulk substrate; and detecting the reflected ultrasonic wave packet. In various non-limiting, exemplary embodiments the method for generating a stable delay time may include the following steps, limitations, features, characteristics, alone or in various combinations as one skilled in the art would readily understand:

comprising using a single CMOS-integrated piezoelectric transducer to transmit and receive the ultrasonic wave packet;

comprising using a single CMOS-integrated piezoelectric transducer to transmit the ultrasonic wave packet and at least one different CMOS-integrated piezoelectric transducer to receive the ultrasonic wave packet;

further comprising laterally locating the at least one CMOS-integrated piezoelectric receive transducer from the single CMOS-integrated piezoelectric transmit transducer at a distance such that the delay is temperature stabilized at adjustable temperatures; wherein the delay is temperature stabilized at at least two adjustable temperatures.

DETAILED DESCRIPTION OF NON-LIMITING, EXEMPLARY EMBODIMENTS

Figure 2A:
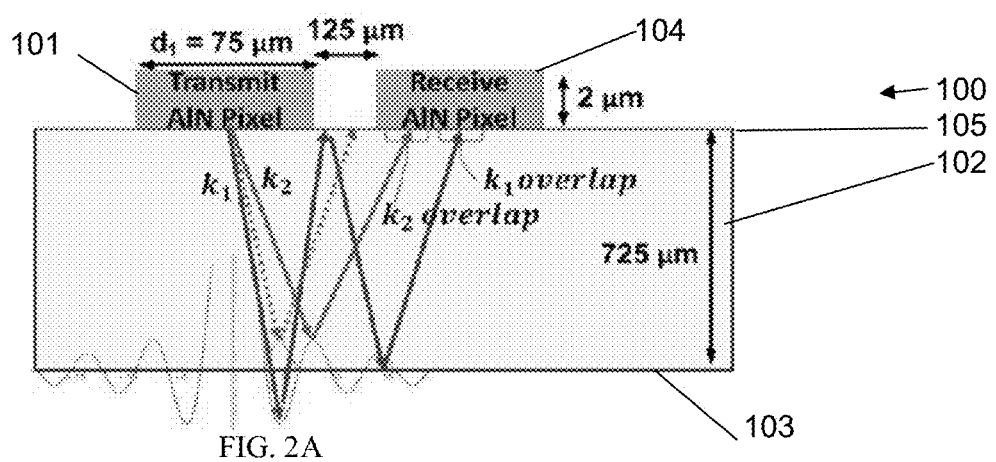
FIG. 2A is a schematic cross sectional view of a transmit/receive delay element illustrating how a zero-temperature coefficient is achieved through the changing path lengths of the diffracted orders of the ultrasonic wave packet reflections.

An embodiment of the invention is an ultrasonic-based delay element (100). In a non-limiting, exemplary embodiment as illustrated in FIG. 2A, an ultrasonic wave packet, $k_2$, generated by a 75 um×75 um AlN piezoelectric [transmit] transducer 101, propagates through the thickness, h (~725 um), of a silicon wafer (substrate) 102, where it experiences approximately total reflection at the bottom 103 of the substrate 102 due to the high acoustic impedance mismatch between silicon and air. Due to reflection of the initial pulse and continuous diffraction of the pulse, part of the ultrasonic wave front can be received by a neighboring AlN piezoelectric [receive] transducer 104 on the top 105 of the silicon. The time for the acoustic wave to be received on this transducer (104) is the delay between the transmitted wave, $k_2$, and the first echo, $k_1$. This delay can be used as an on chip stable delay reference for different timing applications.

Diffraction Based Temperature Compensation

In order to analyze the diffraction patterns, consider acoustic waves induced by a piezoelectric square transducer. The pressure at an off axis observation point can be written as $$\int\int_{-\infty}^{\infty} \frac{rect(\frac{x_1}{L})rect(\frac{y_1}{L})e^{j\frac{\omega}{vz}(x_o x_1+y_o y_1)}e^{-j\frac{\omega}{vz}(x_1^2+y_1^2)}}{R}dx_1 dy_1 \quad (1)$$

$$p(\omega, x_o, y_o, z) = \frac{j\omega p_o}{2\pi v}e^{-j(\frac{\omega}{v})\left[z+\frac{x_o^2+y_o^2}{2z}\right]}$$

where $p_o$ is the pressure induced by the piezoelectric transducer at the transducer's surface, $\omega$ is the angular frequency of the acoustic waves, $v$ is the speed of sound in silicon, $z$, $x_o$, and $y_o$ are the Cartesian coordinates of the observation point, and $L$ is the length of the square transducer. This expression is the Fresnel diffraction expression valid for $$z^3 \gg \frac{L^4}{\lambda}.$$

The AlN pixels used have a resonant frequency of ~1.3 GHz, a thickness of 3 um, and a lateral size of 75 um, the silicon substrate thickness, h, is 725 um, and the speed of sound in silicon is 8433 m/s. As this thickness is much longer than the Fresnel zone length, and also satisfies the Fraunhofer approximation $$z \gg \frac{L^2}{\lambda}),$$

equation (1) can be approximated to $$p(\omega, x_o, y_o = 0, z) = \frac{jp_o \beta L^2}{2\pi R_o}e^{-j\beta\left[z+\frac{x_o^2+y_o^2}{2z}\right]}sinc\left[\frac{Lx_o}{\lambda z}\right]sinc\left[\frac{Ly_o}{\lambda z}\right] \quad (2)$$

where $\beta$ is the wave number of the acoustic wave $$\left(\beta = \frac{\omega}{v}\right).$$

Figure 1:
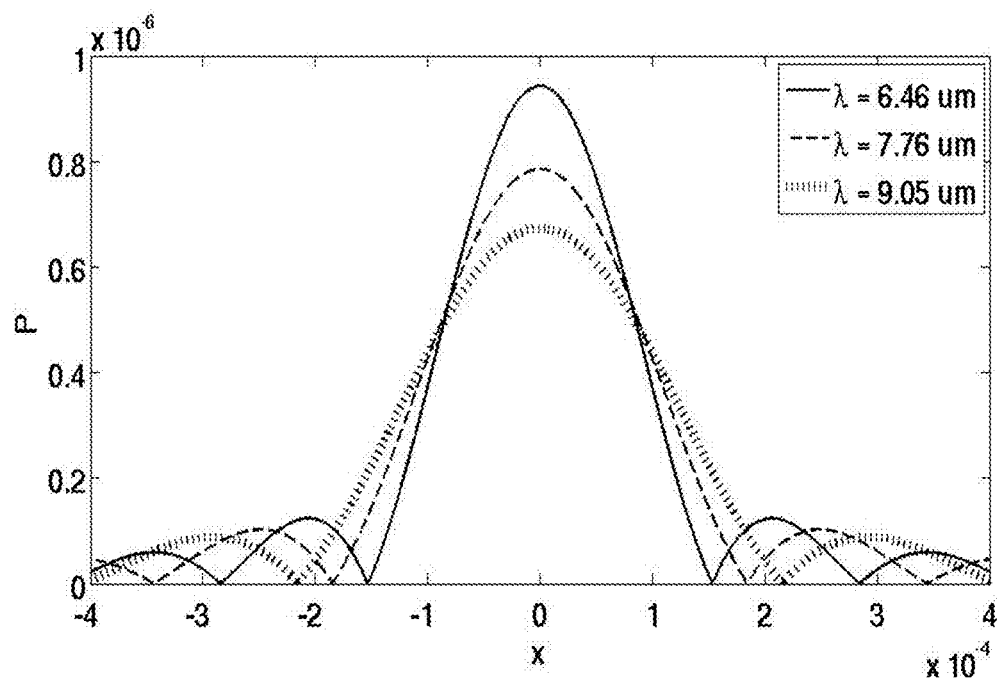
FIG. 1 shows the plot of the diffraction pattern for three different wavelengths at the far field, according to an illustrative explanation of the embodied invention.

Destructive interference from the infinite point sources at the surface of the piezoelectric transducer results in nulls in the diffraction pattern along the x-axis. This can be seen from the locations of the zeros in the function sin c(x), which are located at all values of $x=n\pi$, where n is an integer (n≠0). Due to symmetry, diffraction patterns along the x-axis and the y-axis are identical. At $y_o=0$, the pressure distribution along the x-axis follows the equation $$p(\omega, x_o, y_o = 0, z) = \frac{jp_o \beta L^2}{2\pi R_o} e^{-j\beta \left[z + \frac{x_o^2}{2z}\right]} \text{sinc}\left[\frac{Lx_o}{\lambda z}\right] \quad (3)$$

where $p = 0$ for $x_o \approx \frac{\lambda Z}{L}, \frac{2\lambda Z}{L}, \frac{3\lambda Z}{L}$, From the above expressions, it can be seen that the far field diffraction angle is directly proportional to the wavelength of the propagating pulse, and inversely proportional to the size of the input piezoelectric transducer. FIG. 1 shows the plot of the diffraction pattern for three different wavelengths at the far field.

Figure 2B:
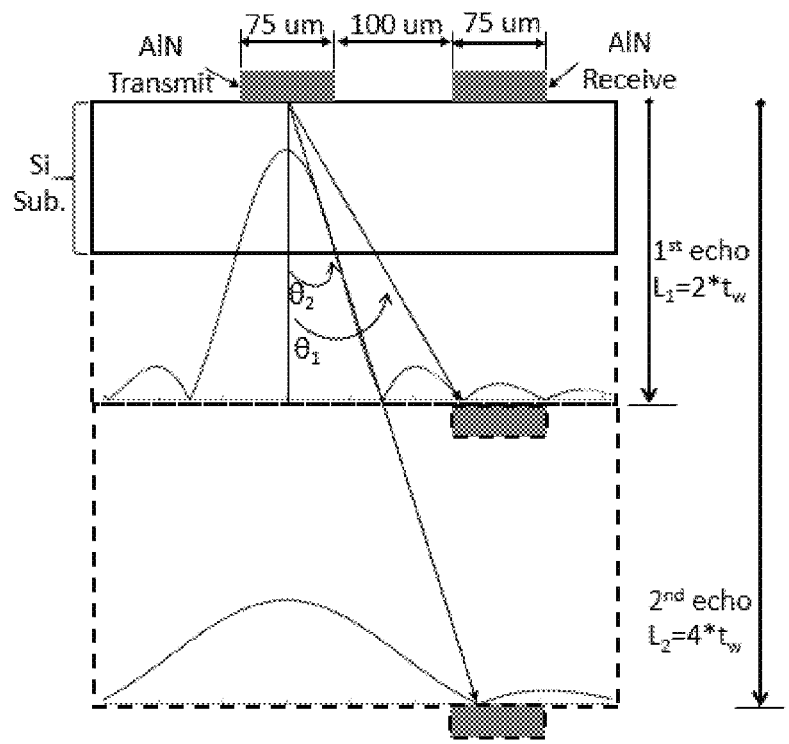
FIG. 2B is a schematic cross sectional view showing two piezoelectric transducers on top of a silicon chip, showing the dimensions used and the diffraction patterns for the first and second echoes, according to an illustrative embodiment of the invention.

In this setup, both the transmitting and the receiving transducers are side by side on the top 105 of the silicon substrate 102. The transmitting transducer 101 is actuated by an input pulse modulated at the resonant frequency of the transducer. The transmitted pulse is reflected at the bottom of the substrate and received by the receiving transducer 104 (FIG. 2A). This results in the first echo, $k_2$, for the transmitted pulse. Due to acoustic impedance mismatch at the top 105 of the silicon substrate, most of the signal power reflects back to the substrate and takes another round trip through the silicon bulk. Hereinafter, the signal received after one round trip will be referred to as the first echo ($k_2$) and the signal received after two round trips will be referred to as the second echo ($k_1$). As an approximation, the first echo diffraction pattern will be modeled by substituting Z with double the silicon chip thickness (~1.45 mm); similarly, the second echo diffraction pattern will be modeled by using a Z equal to four times the chip thickness (~2.9 mm). FIG. 2B is a schematic for the transducers on top of the silicon chip showing the dimensions used and the diffraction patterns for the first and second echoes.

The effect of temperature on the speed of sound in silicon has been discussed in detail in the literature. The acoustic velocity is given by $v=\sqrt{E/\rho}$, E is the stiffness of the material and $\rho$ is its density. For acoustic waves propagating perpendicular to the (100) Si wafer plane, the stiffness decreases approximately linearly with the temperature increase with a temperature coefficient of $-78.8E-6/°$ C. Temperature coefficient is calculated by the equation $$TC = \Delta E/(E_0 \Delta T),$$

where $\Delta E$ and $\Delta T$ are the difference in stiffness and temperature, respectively, and $E_0$ is the stiffness at room temperature.

Temperature impacts the delay of the delay cell in several ways. As temperature increases, stiffness of the delay medium decreases, and as a result, acoustic velocity is reduced. This causes delay to increase linearly with temperature. Also, thickness of silicon increases with temperature through the thermal expansion coefficient of silicon. The total delay between the two echoes can thus be represented by the equation $$\Delta t = \delta_2 - \delta_1 + (t_{rise2} - t_{rise1}) \quad (4)$$

$$\delta_i = \frac{l_i}{c} = \frac{1}{c_0(1-|\beta|\Delta T)} \frac{2it_w(1+\alpha\Delta T)}{\cos(\theta_i(T))}$$

-continued $$\theta_i = \Gamma_i \lambda / t_w = \Gamma_n c(T)/(f t_w) = \frac{\Gamma_n c_0 (1 - |\beta|\Delta T)}{f t_w (1 - \alpha \Delta T)}$$

where $\delta_i$ is the delay time between the initial excitation and the $i^{th}$ echo due to the path length $l_i$, $t_w$ is the thickness of the silicon at room temperature, c is the speed of sound, T is the temperature, f is the frequency, $\theta_i$ is the diffraction angle corresponding to the appropriate null, as in FIG. 2B, and $\Gamma_n$ is an integer that corresponds to the sin c extremums. $t_{rise1}$ and $t_{rise2}$ are the rise times of the first and second echoes, respectively. $\beta$ is the temperature coefficient by which the speed of sound decreases in silicon (~−50 ppm/° C.); $\alpha$ is the thermal expansion coefficient of silicon (~2.6 ppm/° C.). These values indicate that the delay is always a rising function of temperature.

Figure 3:
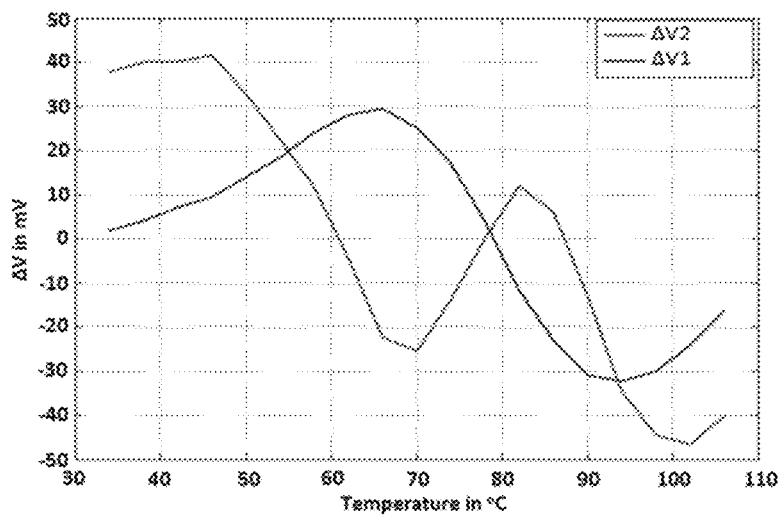
FIG. 3 graphically shows how the received signal amplitude changes with temperature for the first and the second echoes, according to an illustrative embodiment of the invention.

However, as shown in equation (4), additional delay is present due to the circuit effect on measuring the rise time. In FIG. 1, as wavelength decreases, the angle of diffraction decreases. Consequently, the amount of received power changes resulting in changing the rise time of the received echoes, which in turn changes the delay. As an example, in FIG. 2B, in the case of the first echo, as temperature increases the third peak of the diffraction pattern moves away from the receiver transducer range. Consequently, the amount of signal power received at higher temperature is less than the amount received at room temperature. Conversely, for the second echo, as temperature increases the first peak in the diffraction pattern moves towards the range of the receiver transducer. As a result, the amount of signal power received gets greater. As will be shown below, the rise time of the echo pulse is inversely proportional to the received signal amplitude (total received power), so $t_{rise1}$ increases and $t_{rise2}$ decreases causing the total delay in equation (4) to decrease. After a certain threshold the behavior will be reversed and the received signal amplitude increases with temperature at the first echo and decreases with temperature at the second echo causing the delay between the first and the second echoes to increase. FIG. 3 shows how the received signal amplitude changes with temperature for the first and the second echoes.

An envelope detector is used to down-convert the signal from the resonant frequency of the transducer to baseband. We can model the electronic circuit as a rectifier. The signal is rectified using a half wave rectifier Zener diode, then a capacitor is charged by the rectified wave to track the envelope of the signal. The change of rise time is related to the change in the signal amplitude (received signal power) by the capacitor charging equation $$t_{rise} = R_{eff} C \ln\left(1 + \frac{V_T}{V_{peak}}\right) \quad (5)$$

$$\Delta t_{rise} = t_{rise2} - t_{rise1} = R_{eff} C \ln\left(\frac{V_{Peak1}(V_{Peak2}+V_T)}{V_{Peak2}(V_{Peak1}+V_T)}\right)$$

$t_{rise}$ is the pulse rise time in sec, $R_{eff}$ is the effective resistor charging the capacitor in ohms, C is the capacitance of the capacitor in Farad, $V_T$ is the switching threshold voltage, and $V_{peak}$ is the input signal amplitude. $V_{Peak1}$ and $V_{Peak2}$ are normally very close to each other in value, hence, equation (5) can be approximated by the Taylor expansion of the first term giving $$\Delta t_{rise} \approx R_{eff} C \left( \frac{V_{Peak1}(V_{Peak2} + V_T)}{V_{Peak2}(V_{Peak1} + V_T)} - 1 \right) \quad (6)$$

$$\Delta t_{rise} \approx \frac{-R_{eff} C V_T \Delta V_{Peak}}{V_{Peak}(V_{Peak} + V_T)}$$

From (6), as the received power changes ($V_{Peak}$), the rise time also changes. At small variation in peak voltage, $\Delta t_{rise}$ changes linearly with $\Delta V_{peak}$ and the coefficient of variation is proportional to the envelope detector circuit parameters ($R_{eff}$ and C). This second term has a larger component of delay measurement, and makes the delay sensitive to a resistor and capacitance. Hence, if on-chip resistors and capacitors are used, the delay could be susceptible to on-chip process variations and components aging.

Experiment Setup

Figure 4:
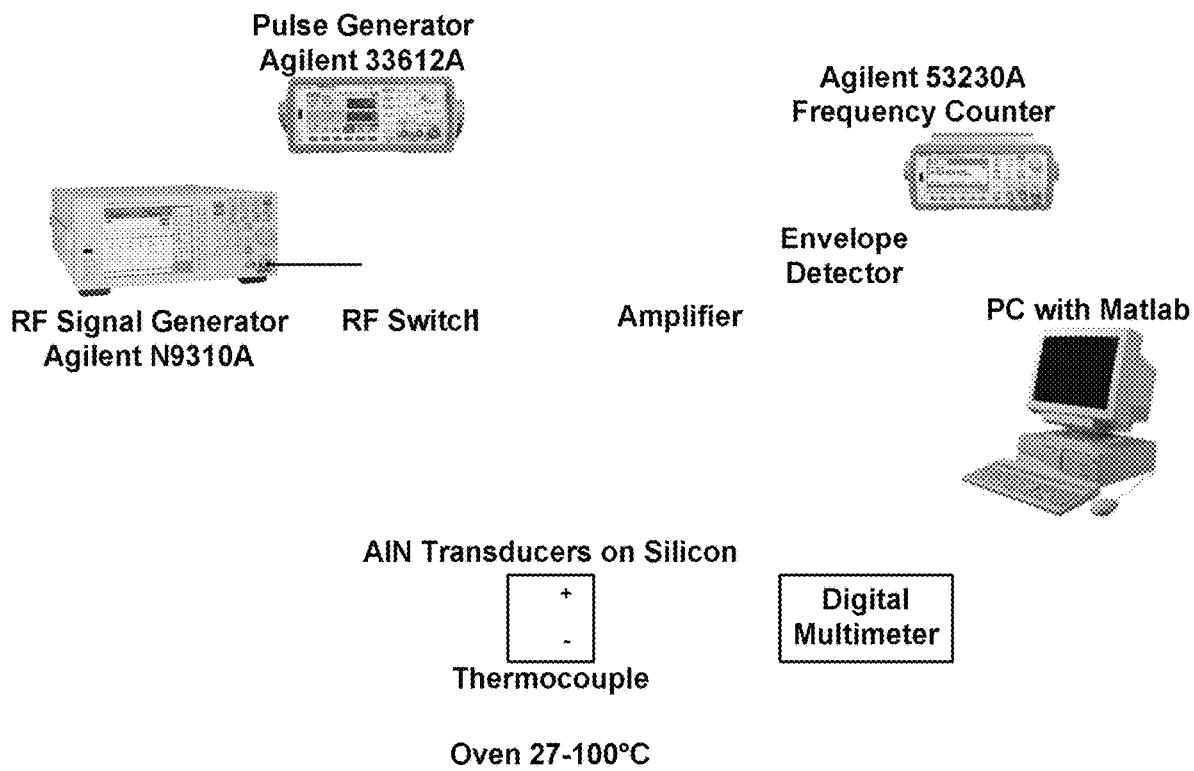
FIG. 4 schematically illustrates an experimental set-up of a stable delay apparatus according to an illustrative embodiment of the invention.

The experiment setup (FIG. 4) comprises an RF signal generator, a pulse generator, an RF switch, the transducers device, a thermocouple to measure the temperature, an oven, an envelope detector, and a frequency counter with high precision to accurately measure the delay. The RF switch is controlled by the pulse generator to create pulses modulated by the high frequency signal generated by the RF signal generator. The pulse width should be less than the time of flight of acoustic waves in silicon so that echoes do not overlap. In our experiment, time of flight for a round trip in silicon is ~175 ns, so the pulse width was chosen to be 80 ns. The pulse is then used to actuate the transmit AlN transducer. The wave generated by the piezoelectric transducer of width 75 um propagates through the thickness of a silicon wafer as illustrated in FIG. 3. The envelope detector is then used to down-convert the received signal and the frequency counter is used to measure the delay between the first 2 echoes.

Measurement Results

Figure 5:
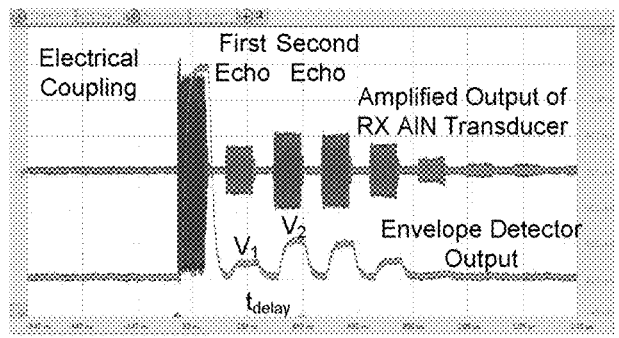
FIG. 5 schematically shows the measured signals at the output of the amplifier and the output of the envelope detector. The first pulse is due to electrical coupling of the transmit signal to the receive transducer. This is followed by several acoustic echoes; according to an illustrative embodiment of the invention.

FIG. 5 shows the measured signals at the output of the amplifier and the output of the envelope detector. The first pulse is due to electrical coupling of the transmit signal to the receive transducer. This is followed by several acoustic echoes. The reference delay of interest is the delay between the first and the second echo. However, the same analysis applies to the delay between all consecutive echoes. At room temperature, the delay between each two consecutive pulses is ~175 ns. The input frequency to the envelope detector is 1.31 GHz, which is the resonance frequency of the piezoelectric transducer.

Figure 6:
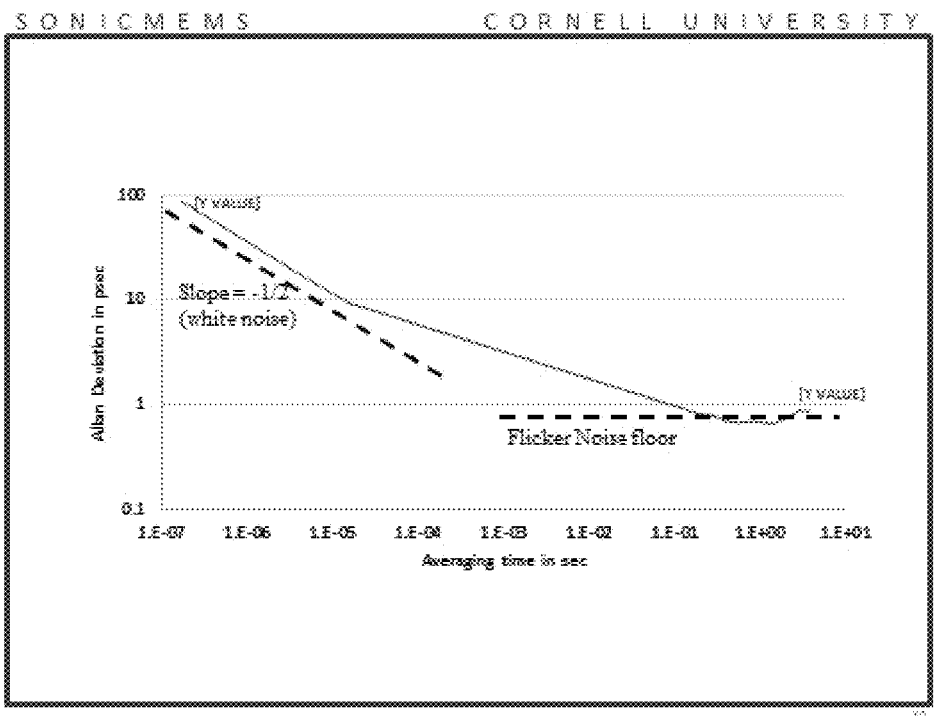
FIG. 6 graphically shows the Allan deviation curve for the delay between the first and the second echoes, according to an illustrative embodiment of the invention.

The Allan deviation curve is calculated for the delay of interest as a metric of stability. The Allan deviation is the square root of the Allan variance, which is half of the average of the squares of the differences between successive delay readings over a certain time period. The Allan deviation allows different types of noise to be distinguished based on the Allan curve slope when plotted on log-log plot. FIG. 6 shows the Allan deviation curve for the delay between the first and the second echoes. The curve starts with a slope of −½ due to white noise, then slope starts to decrease until it flattens at the flicker noise floor, where more averaging doesn't help in noise reduction. Unlike the conventional Allan deviation curves, the curve doesn't start with a −1 slope, which means that the system doesn't suffer from quantization noise. A minimum standard deviation of 0.87 ps is achieved, which corresponds to a delay error of 5 ppm.

Figure 7:
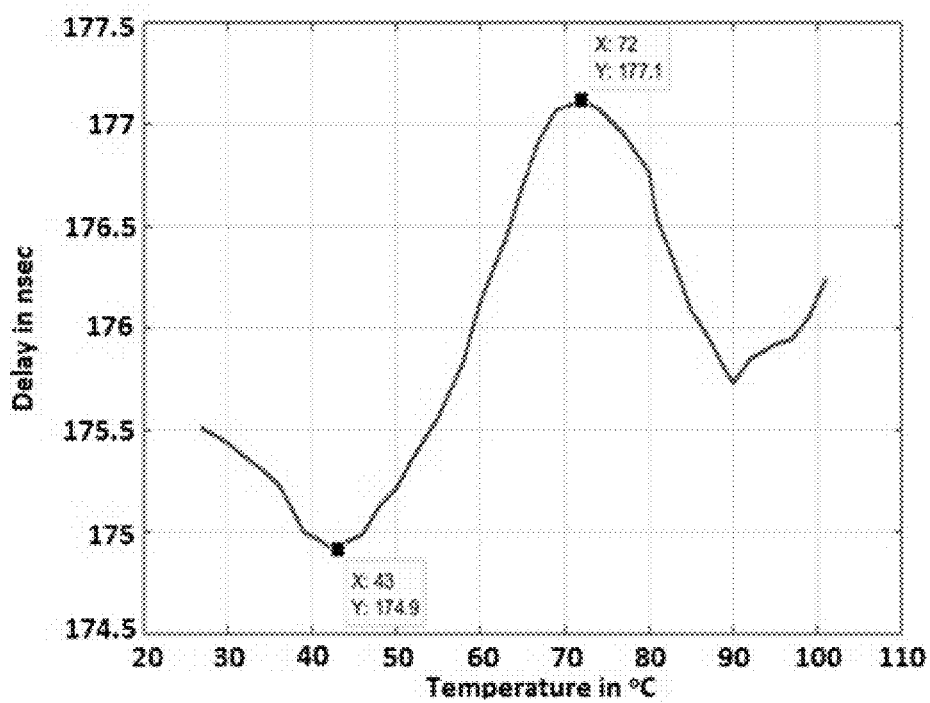
FIG. 7 graphically shows the measured delay across temperature. The effect of the diffraction pattern change can be clearly seen; according to an illustrative embodiment of the invention.
Figure 8:
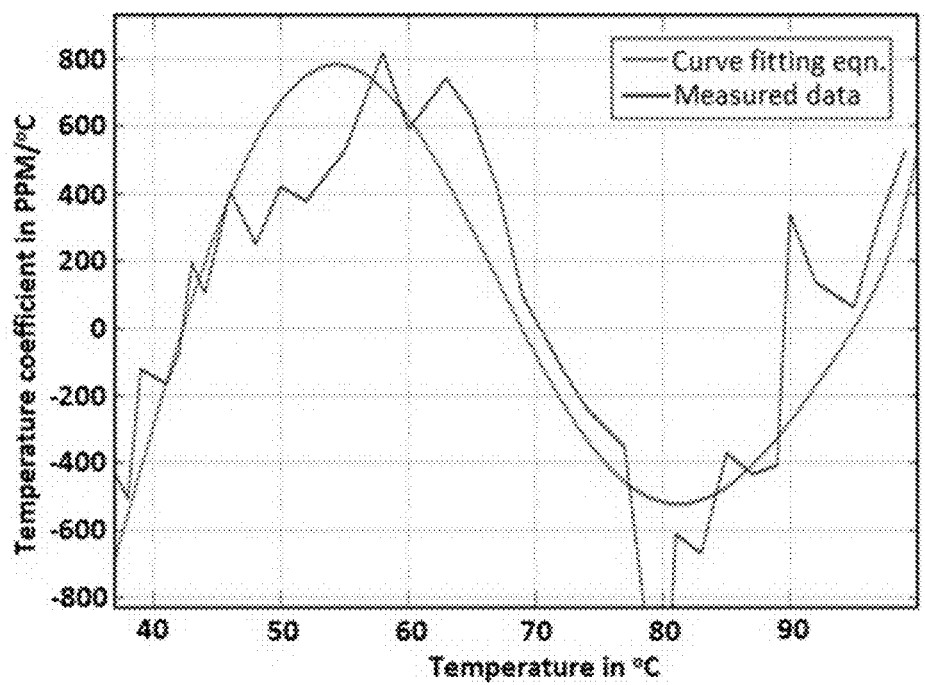
FIG. 8 graphically illustrates the temperature effect on delay time in PPM/° C. Around 43° C. and 72° C., the temperature coefficient is 0, according to an illustrative embodiment of the invention.

FIG. 7 shows the measured delay across temperature. The effect of the diffraction pattern change discussed earlier can be clearly seen. The temperature effect on $t_{delay}$ in PPM/° C. is shown in FIG. 8. Around 43° C. and 72° C., the temperature coefficient is 0. These values can be changed through the experiment setup parameters like the receiver position, the actuation frequency, and the effective resistance and the output capacitance of the envelope detector, allowing one to program to body temperature (37° C.) for human body sensing modalities.

Disclosed herein is a novel CMOS compatible delay element based on ultrasound signal propagation through the silicon bulk. The delay element enables high long term stability with an Allan deviation of 0.87 ps (<6 ppm). Also, due to the diffraction angle dependence on temperature, a zero temperature coefficient was demonstrated at 43° C. and 72° C. The transmit-receive geometries can be designed with different spacing, higher number of electrodes for differential delay measurement, and differential receive electronic characteristics. For example, a single transmit/receive piezoelectric transduces may be used in an exemplary embodiment.

Figure 9:
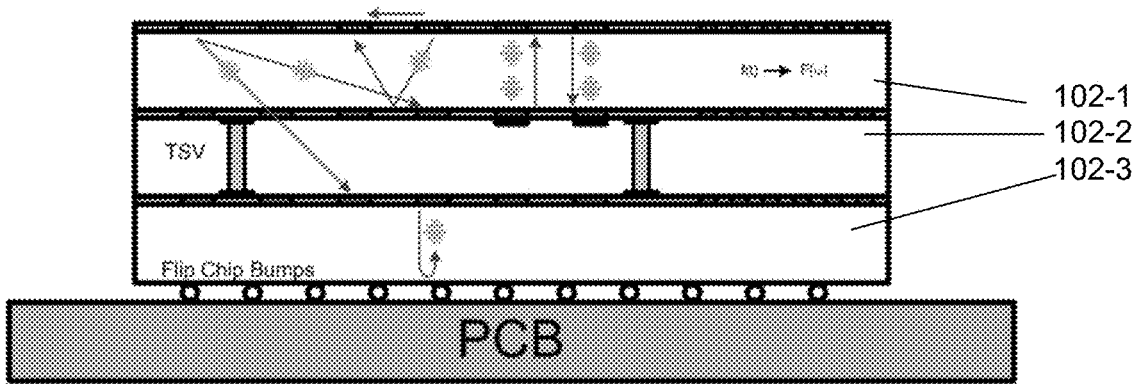
FIG. 9 is a schematic cross sectional view of a transmit/receive delay element including a stacked plurality of substrates according to an illustrative embodiment of the invention.

In another exemplary embodiment as illustrated in FIG. 9, a transmit/receive delay element includes a stacked plurality (three shown) of substrates 102-1, 102-2, 103-3. Substrates with piezoelectric pixels can be distributed within each layer and across the layers such that transmitted signals can be received at different substrates due to reflections originating from impedance mismatches. These impedance mismatches can be designed by creating pockets or allowing adding layers with different impedances. The received signals at different substrates measure differential delays to cancel effects of temperature effects on speeds of sounds.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An integrated delay apparatus, comprising:
a substrate;
a piezoelectric transducer integrally disposed on or in the substrate,
wherein the piezoelectric transducer is adapted to generate an ultrasonic wave packet having a temporal width from 0.5 to 100 nanoseconds,
further wherein the substrate has a thickness, h, that is greater than a spatial width of the ultrasonic wave packet corresponding to the temporal width,
further wherein an interface between a bottom surface of the substrate and a medium immediately adjacent the bottom surface of the substrate exhibits an impedance mismatch whereby the bottom surface of the substrate is a reflective surface for the ultrasonic wave packet; and
further wherein the integrated delay apparatus is characterized by a delay time, τ, where τ≥2h/$v_s$, where $v_s$ is a speed of sound in the substrate.

2. The integrated delay apparatus of claim 1, wherein the interface between the bottom surface of the substrate and the medium immediately adjacent the bottom surface of the substrate is a channel or a cavity in a portion of the bottom surface of the substrate.

3. The integrated delay apparatus of claim 1, wherein the substrate is a material characterized as having a low GHz-ultrasonic wave packet transmission loss.

4. The integrated delay apparatus of claim 3, wherein the substrate is one of Si, SOI, Sapphire, SiC, GaN, a semiconductor, a piezo-material, or a metal.

5. The integrated delay apparatus of claim 1, wherein the piezoelectric transducer is aluminum nitride (AlN).

6. The integrated delay apparatus of claim 1, further comprising a plurality of the substrates including the piezoelectric transducer, wherein the plurality of the substrates are vertically stacked.

7. The integrated delay apparatus of claim 1, wherein the piezoelectric transducer is a transmitting and a receiving transducer.

8. The integrated delay apparatus of claim 1, wherein the piezoelectric transducer is a transmitting transducer, and further comprising at least one receiving piezoelectric transducer integrally disposed on or in the substrate.

9. The integrated delay apparatus of claim 8, wherein the transmitting piezoelectric transducer has a largest transverse surface dimension between 0.5 to 20λ, where λ is a longitudinal wavelength of the ultrasonic wave packet with a carrier frequency, f, where f is between 0.5 to 10 GHz.

10. The integrated delay apparatus of claim 8, wherein the at least one receiving piezoelectric transducer is a lateral distance from the transmitting transducer so as to receive a reflected ultrasonic wave packet.

11. The integrated delay apparatus of claim 8, wherein the at least one receiving piezoelectric transducer comprises an integrally disposed periodic array of receiving piezoelectric transducers.

12. The integrated delay apparatus of claim 8, wherein the at least one receiving piezoelectric transducer is integrally disposed on one of a top surface of the substrate, a bottom surface of the substrate, or in the substrate.

13. The integrated delay apparatus of claim 1, characterized by an Allan deviation of 0.87 ps (<6 ppm).

14. The integrated delay apparatus of claim 1, wherein τ>100 ns.

15. The integrated delay apparatus of claim 1, characterized by a zero-temperature coefficient of delay at two or more temperatures.

16. The integrated delay apparatus of claim 1, characterized in that the integrated delay apparatus is a CMOS integrated delay line.

17. An integrated delay apparatus, comprising
a substrate;
a transmitting piezoelectric transducer integrally disposed on or in the substrate;
a receiving piezoelectric transducer integrally disposed on or in the substrate;
wherein the transmitting piezoelectric transducer is adapted to generate an ultrasonic was pocket having a temporal width form 0.5 to 100 nanoseconds;
further wherein the substrate has a thickness, h, that is greater than a spatial width of the ultrasonic wave packet corresponding to the temporal width;
further wherein an interface between a bottom surface of the substrate and a medium immediately adjacent the bottom surface of the substrate exhibits an impedance mismatch whereby the bottom surface of the substrate is a reflective surface for the ultrasonic wave packet; and
further wherein the transmitting piezoelectric transducer has a largest transverse surface dimension between 0.5 to 20λ, where λ is a longitudinal wavelength of the ultrasonic wave packet with a carrier frequency, f, where f is between 0.5 to 10 GHz.

18. A method for generating a stable delay time, comprising:
generating an ultrasonic wave packet having a temporal width from 0.5 to 100 ns with a carrier frequency, f, where f is between 0.5 to 10 GHz;
transmitting, using a CMOS-integrated piezoelectric transmit transducer, the ultrasonic wave packet through a bulk substrate;
reflecting the transmitted ultrasonic wave packet from a top and/or a bottom surface of the bulk substrate; and
detecting, using a CMOS-integrated piezoelectric transmit transducer, the reflected ultrasonic wave packet;
wherein the CMOS-integrated piezoelectric receive transducer is laterally located at a distance from the CMOS-integrated piezoelectric transmit transducer such that the delay is temperature stabilized at adjustable temperatures.

19. An integrated delay apparatus, comprising:
a substrate;
a piezoelectric transducer integrally disposed on or in the substrate;
wherein the piezoelectric transducer is adapted to generate an ultrasonic wave packet having a temporal width from 0.5 to 100 nanoseconds;
further wherein the substrate has a thickness, h, that is greater than a spatial width of the ultrasonic wave packet corresponding to the temporal width;
further wherein an interface between a bottom surface of the substrate and a medium immediately adjacent the bottom surface of the substrate exhibits an impedance mismatch whereby the bottom surface of the substrate is a reflective surface for the ultrasonic wave packet; and
further wherein the integrated delay apparatus is characterized by an Allan deviation of 0.87 ps (<6 ppm).

* * * * *

UNITED STATES PATENT AND TRADEMARK OFFICE
CERTIFICATE OF CORRECTION

PATENT NO. : 10,771,043 B2  
APPLICATION NO. : 16/085699  
DATED : September 8, 2020  
INVENTOR(S) : Amit Lal, Mamdouh Abdelmejeed and Justin Kuo Page 1 of 1

It is certified that error appears in the above-identified patent and that said Letters Patent is hereby corrected as shown below:

In the Claims

Column 9, Line 48, in Claim 17, please delete the words "was pocket" and replace them with the words --wave packet--

Column 9, Line 49, in Claim 17, please delete the word "form" and replace it with the word --from--

Column 10, Lines 25-26, in Claim 18, please delete the word "transmit" and replace it with the word --receive--

Signed and Sealed this  
Nineteenth Day of January, 2021

Andrei Iancu  
*Director of the United States Patent and Trademark Office*